United States Patent
Yoo et al.

(10) Patent No.: US 10,692,845 B2
(45) Date of Patent: Jun. 23, 2020

(54) METHOD FOR ARRAYING MICRO-LED CHIPS FOR MANUFACTURING LED DISPLAY PANEL AND MULTI-CHIP CARRIER USED IN THE METHOD

(71) Applicant: LUMENS CO., LTD., Yongin-si, Gyeonggi-do (KR)

(72) Inventors: Taekyung Yoo, Yongin-si (KR); Juok Seo, Yongin-si (KR); Bogyun Kim, Yongin-si (KR); Gunha Kim, Yongin-si (KR); Jugyeong Mun, Yongin-si (KR)

(73) Assignee: LUMENS CO., LTD., Yongin-si (KR)

( * ) Notice: Subject to any disclaimer, the term of this patent is extended or adjusted under 35 U.S.C. 154(b) by 0 days.

(21) Appl. No.: 16/273,615

(22) Filed: Feb. 12, 2019

(65) Prior Publication Data

US 2019/0252358 A1 Aug. 15, 2019

(30) Foreign Application Priority Data

Feb. 14, 2018 (KR) .................. 10-2018-0018125
Oct. 16, 2018 (KR) .................. 10-2018-0123402

(51) Int. Cl.
*H01L 25/075* (2006.01)
*H01L 23/00* (2006.01)
(Continued)

(52) U.S. Cl.
CPC .......... *H01L 25/0753* (2013.01); *H01L 24/95* (2013.01); *H01L 27/156* (2013.01); *H01L 33/005* (2013.01); *H01L 33/48* (2013.01)

(58) Field of Classification Search
CPC ... H01L 25/0753; H01L 33/48; H01L 27/156; H01L 33/005; H01L 24/95; H01L 2224/81005; H01L 24/81; H01L 24/75; H01L 24/32; H01L 24/29; H01L 24/16; H01L 24/13
(Continued)

(56) References Cited

U.S. PATENT DOCUMENTS

| 2002/0031660 A1* | 3/2002 | Hashizume | ............... B32B 3/02 428/343 |
| 2017/0254518 A1* | 9/2017 | Vasylyev | ............... F21V 17/007 |
| 2018/0242481 A1* | 8/2018 | Lam | ..................... H05K 13/003 |

FOREIGN PATENT DOCUMENTS

| JP | 2002-267893 A | 9/2002 |
| JP | 2003-31847 A | 1/2003 |

(Continued)

*Primary Examiner* — Fernando L Toledo
*Assistant Examiner* — Adam S Bowen
(74) *Attorney, Agent, or Firm* — Mei & Mark LLP

(57) ABSTRACT

A method for arraying micro-LED chips is disclosed. The method includes preparing a chip carrier formed with a plurality of chip pockets whose internal pressure is reduced through a plurality of suction holes, capturing the micro-LED chips in the corresponding chip pockets such that the micro-LED chips are in close contact with the bottoms of the chip pockets, and placing the micro-LED chips captured in the chip pockets on a base body. Each of the chip pockets includes a slope through which an inlet having a larger width than the bottom is connected to the bottom. The distances between the centers of the adjacent micro-LED chips placed on the base body are the same as those between the centers of the corresponding chip pockets.

13 Claims, 13 Drawing Sheets

(51) Int. Cl.
   *H01L 33/00*    (2010.01)
   *H01L 27/15*    (2006.01)
   *H01L 33/48*    (2010.01)
(58) Field of Classification Search
   USPC .......................................................... 257/88
   See application file for complete search history.

(56) References Cited

FOREIGN PATENT DOCUMENTS

JP      2016-66765 A      4/2016
WO      2017/075776 A1    5/2017

\* cited by examiner

METHOD FOR ARRAYING MICRO-LED CHIPS FOR MANUFACTURING LED DISPLAY PANEL AND MULTI-CHIP CARRIER USED IN THE METHOD

BACKGROUND OF THE INVENTION

1. Field of the Invention

The present invention relates to a technology for manufacturing an LED display panel, and more specifically to a method for arraying micro-LED chips for manufacturing an LED display panel and a multi-chip carrier used in the method.

2. Description of the Related Art

Vertical or flip-chip type micro-LED chips are bonded to a substrate such as a printed circuit board (PCB) and are arrayed on the substrate to fabricate a micro-LED module for a micro-LED display panel. For this array, the micro-LED chips sorted on a chip retaining film need to be accurately transferred and bonded to solders disposed on the substrate.

The distances between the micro-LED chips sorted on the chip retaining film are different from those between the solders disposed on the substrate. Thus, there has been proposed a method in which the positions of the solders on the substrate are individually checked and a die bonder is then used to bond the micro-LED chips to the corresponding solders disposed on the substrate. However, this method has the disadvantage that too much processing time is involved in transferring and bonding the large number of micro-LED chips to the substrate one by one.

An alternative method has been proposed in which the micro-LED chips sorted on the chip retaining film are rearranged corresponding to pixel sizes and are then transferred by a suitable bonding process, for example, roll-to-roll or electrostatic bonding. However, this method has difficulty in applying to the manufacture of micro-LED display panels on a commercial scale because the degree of precision of the distances between the rearranged micro-LED chips should be as high as few micrometers and the rearrangement rate should also be high. Also when mini-LED display panels are manufactured using LED chips larger than micro-LED chips on a large scale, the degree of precision of the distances between the LED chips should be in the range of ±10 μm, which is also difficult to achieve.

When LED chips are transferred by a typical bonding process such as roll-to-roll or electrostatic bonding, an adhesive sheet should be attached or transferred to the upper surfaces (i.e. light-emitting surfaces) of the rearranged LED chips. Upon subsequent removal of the adhesive sheet, a very small amount of the adhesive may remain unremoved on the LED chips, causing poor luminous efficiency.

Many methods have been attempted to transfer LED chips to substrates. However, most of these methods fail to meet the requirement for correct X/Y/Z arrangement of LED chips sufficient to fabricate displays. Further, reflow of LED chips for bonding may increase the risk of unwanted phenomena, such as turning and distortion of the LED chips.

SUMMARY OF THE INVENTION

It is one object of the present invention to provide a method for arraying a large number of small-sized LED chips (for example, micro-LED chips) on a base body as a substrate at one time with precision after the LED chips at given positions are transferred to the substrate.

It is another object of the present invention to provide a multi-chip carrier used to easily collect small-sized LED chips (for example, micro-LED chips) without disordering the LED chips and to accurately transfer the LED chips to the surface of a base body.

A method for arraying micro-LED chips according to one aspect of the present invention includes: preparing a chip carrier formed with a plurality of chip pockets whose internal pressure is reduced through a plurality of suction holes; capturing the micro-LED chips in the corresponding chip pockets such that the micro-LED chips are in close contact with the bottoms of the chip pockets; and placing the micro-LED chips captured in the chip pockets on a base body, wherein each of the chip pockets includes a slope through which an inlet having a larger width than the bottom is connected to the bottom and wherein the distances between the centers of the adjacent micro-LED chips placed on the base body are the same as those between the centers of the corresponding chip pockets.

According to one embodiment, the movement of each of the micro-LED chips aligned in the chip pockets is limited by the slope.

According to one embodiment, the depth of each of the chip pockets is smaller than the thickness of the corresponding micro-LED chip.

According to one embodiment, the suction holes are in communication with the corresponding chip pockets at the bottom of the chip carrier.

According to one embodiment, the number of the suction holes for each of the chip pockets is two or more.

According to one embodiment, the chip pockets are formed at one side of a suction plate of the chip carrier, and the suction holes are formed at the other side of the suction plate and are in communication with the bottoms of the corresponding chip pockets.

According to one embodiment, the placing includes increasing the internal pressure of the chip pockets in a state in which the micro-LED chips are placed on the base body.

According to one embodiment, electrode pads of the micro-LED chips protrude upward from the corresponding chip pockets of the chip carrier when the micro-LED chips are captured and protrude downward from the corresponding chip pockets of the chip carrier when the micro-LED chips are placed.

According to one embodiment, the method further includes half-turning the chip carrier in which the captured micro-LED chips are aligned in the corresponding chip pockets.

According to one embodiment, the micro-LED chips are captured in the corresponding chip pockets such that the light emitting surfaces of the micro-LED chips are in contact with the bottoms of the chip pockets and electrode pads of the micro-LED chips are exposed from the chip pockets.

According to one embodiment, the base body is a mount substrate having electrodes and the micro-LED chips are placed on the mount substrate such that the electrode pads are close to the electrodes.

According to one embodiment, the base body is an adhesive film and the micro-LED chips are placed on the adhesive film such that the electrode pads are attached to the adhesive film.

According to one embodiment, the method further includes transferring the micro-LED chips attached to the surface of the adhesive film to the surface of the mount substrate.

According to one embodiment, the micro-LED chips are captured in the corresponding chip pockets such that electrode pads of the micro-LED chips are in contact with the bottoms of the chip pockets and the light emitting surfaces of the micro-LED chips are exposed from the chip pockets.

According to another aspect of the present invention, there is provided a multi-chip carrier for aligning a plurality of micro-LED chips in a predetermined arrangement and placing the aligned micro-LED chips on a base body, including a suction plate and a plurality of chip pockets formed in a predetermined arrangement at one side of the suction plate to suck the plurality of micro-LED chips wherein the shapes and sizes of the bottoms of the chip pockets are determined such that the movement of each of the micro-LED chips sucked in the corresponding chip pockets is limited and wherein each of the chip pockets includes a slope through which an inlet having a larger width than the bottom is connected to the bottom.

According to one embodiment, the depth of each of the chip pockets is smaller than the thickness of the corresponding micro-LED chip.

According to one embodiment, the chip carrier further includes a plurality of suction holes in communication with the corresponding chip pockets at the bottom of the chip carrier.

According to one embodiment, the number of the suction holes for each of the chip pockets is two or more.

According to one embodiment, the suction holes are connected to an external vacuum source.

According to one embodiment, the multi-chip carrier is made of Si, GaAs, sapphire or AlN.

Effects of the present invention will be better understood from the following description of the embodiments.

DETAILED DESCRIPTION OF THE INVENTION

Preferred embodiments of the present invention will now be described in detail with reference to the accompanying drawings.

Figure 1:
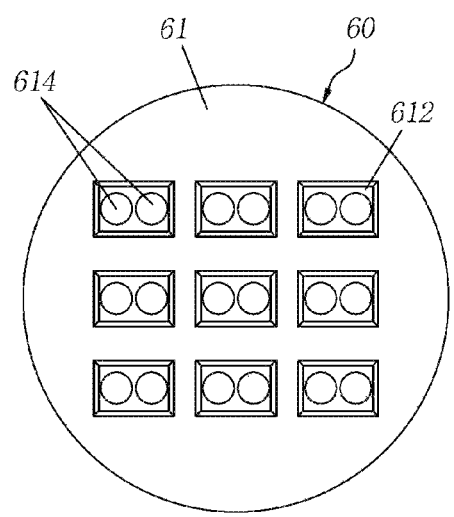
FIG. 1 is a plan view illustrating a multi-chip carrier according to one embodiment of the present invention.
Figure 2:
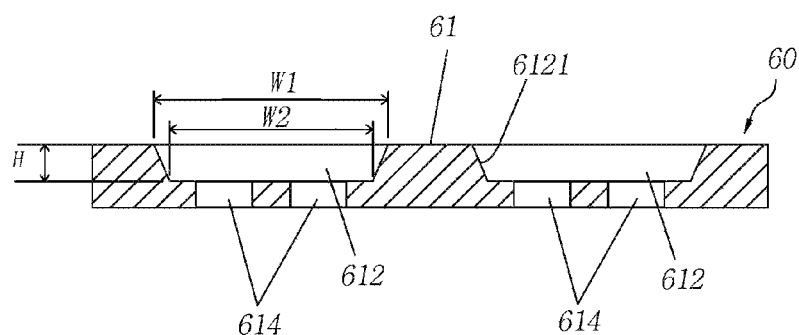
FIG. 2 is a partially enlarged cross-sectional view of a multi-chip carrier according to one embodiment of the present invention.
Figure 3:
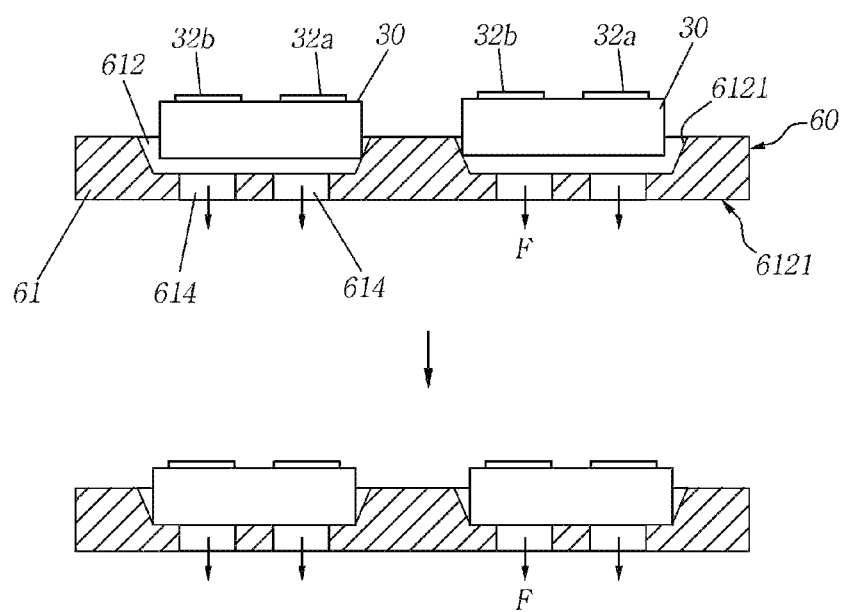
FIGS. 3 and 4 illustrate one embodiment of a method for arraying LED chips using the multi-chip carrier illustrated in FIGS. 1 and 2.
Figure 4:
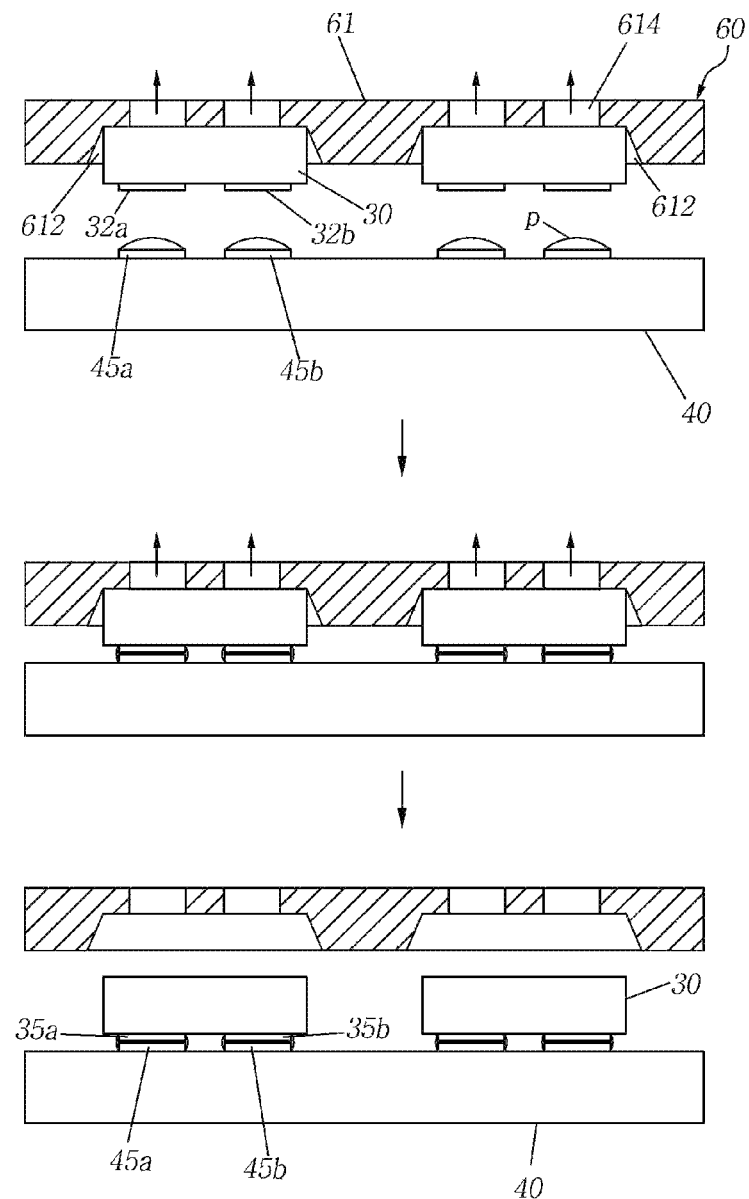

FIGS. 1 and 2 illustrate a multi-chip carrier according to one embodiment of the present invention and FIGS. 3 and 4 illustrate one embodiment of a method for arraying LED chips using the multi-chip carrier.

The method includes preparing a chip carrier, capturing chips, and placing the chips.

First, a chip carrier 60 is prepared, as illustrated in FIGS. 1 and 2. The chip carrier 60 is used to capture a plurality of micro-LED chips and place the captured micro-LED chips on a mount substrate in the subsequent steps. The outer shape of the chip carrier 60 is not limited. As illustrated, the chip carrier 60 may have a substantially circular shape in cross section. Alternatively, the chip carrier 60 may have a quadrangular shape in cross section.

The chip carrier 60 includes a suction plate 61 formed with a plurality of chip pockets 612 in a predetermined arrangement at one side thereof. The suction plate 61 includes suction holes 614 formed corresponding to the chip pockets 612. The suction holes 614 are formed at the other side of the suction plate 61 and are in communication with the bottom surfaces of the chip pockets 612. Micro-LED chips 30 are sucked into the chip pockets 612 by reducing the internal pressure of the chip pockets 612 through the corresponding suction holes 614. The suction holes 614 are connected to an external vacuum source. The sucked micro-LED chips accommodated in the chip pockets 612 can be separated from the chip pockets 612 by increasing the internal pressure of the chip pockets 612. The number of the suction holes 614 for each of the chip pockets 612 is preferably two or more.

The suction plate 61 of the chip carrier 60 is made of Si, GaAs, sapphire or AlN. Each of the chip pockets 612 has a depth H smaller than the thickness of the corresponding micro-LED chip to be sucked. Here, the thickness of the micro-LED chip indicates the distance between the light emitting surface of the micro-LED chip and the surface of an electrode pad of the micro-LED chip. Each of the chip pockets 612 is dimensioned such that the transverse width W1 of the inlet of the chip pocket is larger than the transverse width W2 of the bottom of the chip pocket. Each of the chip pockets 612 has a slope 6121 through which the inlet having the larger width W1 than the bottom having the transverse width W2 is connected to the bottom. The transverse width W1 of the inlet of each of the chip pockets 612 is larger than that of the corresponding micro-LED chip and the transverse width W2 of the bottom of the chip pocket 612 is the same as that of the micro-LED chip. Here, the term "same" means that the difference between the two transverse widths is negligible within the error range. Although not illustrated, the longitudinal width of the inlet of each of the chip pockets is larger than that of the bottom of the chip pocket, and the longitudinal width of the micro-LED chip is larger than that of the inlet of the chip pocket and is almost the same as that of the bottom of the chip pocket.

Referring to FIG. 3, the chips are captured. Specifically, when the external vacuum source connected with the suction holes 614 is operated, the internal pressure of the suction holes 614 is reduced. As a result, the micro-LED chips 30, which are at least partially latched to the inlets of the chip pockets 612, are introduced into the corresponding chip pockets 612 and are situated on the bottoms of the chip pockets 612. By the vacuum suction force through the suction holes 614, the micro-LED chips 30 are adsorbed to and remain unseparated from the bottoms of the corresponding chip pockets 612. As mentioned earlier, the slope 6121 connecting the inlet to the bottom of each chip pocket 612 facilitates insertion of the micro-LED chip 30 into the chip pocket 612. In addition, since the width of the bottom of the chip pocket 612 is almost identical to the width of the micro-LED chip, the micro-LED chip can be fixed in an exact position without clearance in the chip pocket 612. Accordingly, the micro-LED chips 30 introduced into and retained in the corresponding chip pockets 612 may be arranged with the same distances between their centers as the distances between the centers of the chip pockets 612. In addition, so long as the internal vacuum of the chip pockets 612 is not released, the arrangement of the micro-LED chips 30 accommodated in the chip pockets 612 and the distances between the micro-LED chips 30 can be maintained unchanged. For example, when the micro-LED chips sucked into the chip pockets are placed down on given positions, the resulting force may cause small errors. For this or other reasons, it is substantially impossible that the distances between the centers of the arranged micro-LED chips are completely consistent with those between the centers of the chip pockets. Thus, the distances between the centers of the arranged micro-LED chips and the distances between the centers of the chip pockets are considered substantially the same although they are not completely consistent with each other. Herein, the distances between the centers of the arranged micro-LED chips and the distances between the centers of the chip pockets are defined to be the same when their difference is within 5 μm.

A base body on which the micro-LED chips 30 are placed may be a mount substrate 40 (see FIG. 4) provided with electrodes 45a and 45b (see FIG. 4). In this case, each of the micro-LED chips 30 includes electrode pads 32a and 32b at the side opposite the side adsorbed to the bottom surface of the corresponding chip pocket 612. The electrode pads 32a and 32b correspond to the electrodes 45a and 45b (see FIG. 4), respectively. That is, the chip carrier 60 sucks the micro-LED chips 30 into the chip pockets 612 and accommodates and retains the micro-LED chips 30 such that the light emitting surfaces of the micro-LED chips 30 are in contact with the bottom surfaces of the chip pockets 612 and the electrode pads 32a and 32b are exposed from the chip pockets 612. When the micro-LED chips 30 are captured, the force of gravity as well as the vacuum suction force acts on the micro-LED chips 30 and allows the micro-LED chips 30 to be introduced into the upwardly widened chip pockets 612.

Referring to FIG. 4, the chip carrier 60 is half turned, i.e. the chip carrier 60 is inverted such that the chip pockets 612 and the micro-LED chips 30 sucked into the chip pockets 612 are directed toward the underlying mount substrate 40. Next, the chip carrier 60 descends or the mount substrate 40 ascends until the micro-LED chips 30 are placed on the mount substrate 40. As mentioned previously, the depth of each of the chip pockets 612 is smaller than the thickness of the corresponding micro-LED chip 30. With these dimensions, the electrode pads 32a and 32b of the micro-LED chips 30 come into contact with or are close to the electrodes 45a and 45b of the mount substrate 40, respectively, when the chip carrier 60 maximally descends or the mount substrate 40 maximally ascends. A bonding material p may be previously coated on the electrodes 45a and 45b. For example, when the internal pressure of the chip pockets 612 is increased by stopping the operation of the external vacuum source connected with the suction holes 614 or another suitable way in a state in which the micro-LED chips 30 are placed on the mount substrate 40, the micro-LED chips 30 can be separated from the chip pockets 612.

A further embodiment of a method for arraying LED chips using the multi-chip carrier illustrated in FIGS. 1 and 2 will be described with reference to FIGS. 5 and 6.

The method includes preparing a chip carrier, capturing chips, and placing the chips as in the previous embodiment. The method further includes transferring the chips.

First, a chip carrier 60 is prepared in substantially the same manner as in the previous embodiment.

Micro-LED chips 30 picked up by the chip carrier 60 are placed on the surface of an adhesive film 7 in this embodiment instead of on a mount substrate including electrodes in the previous embodiment.

Figure 5:
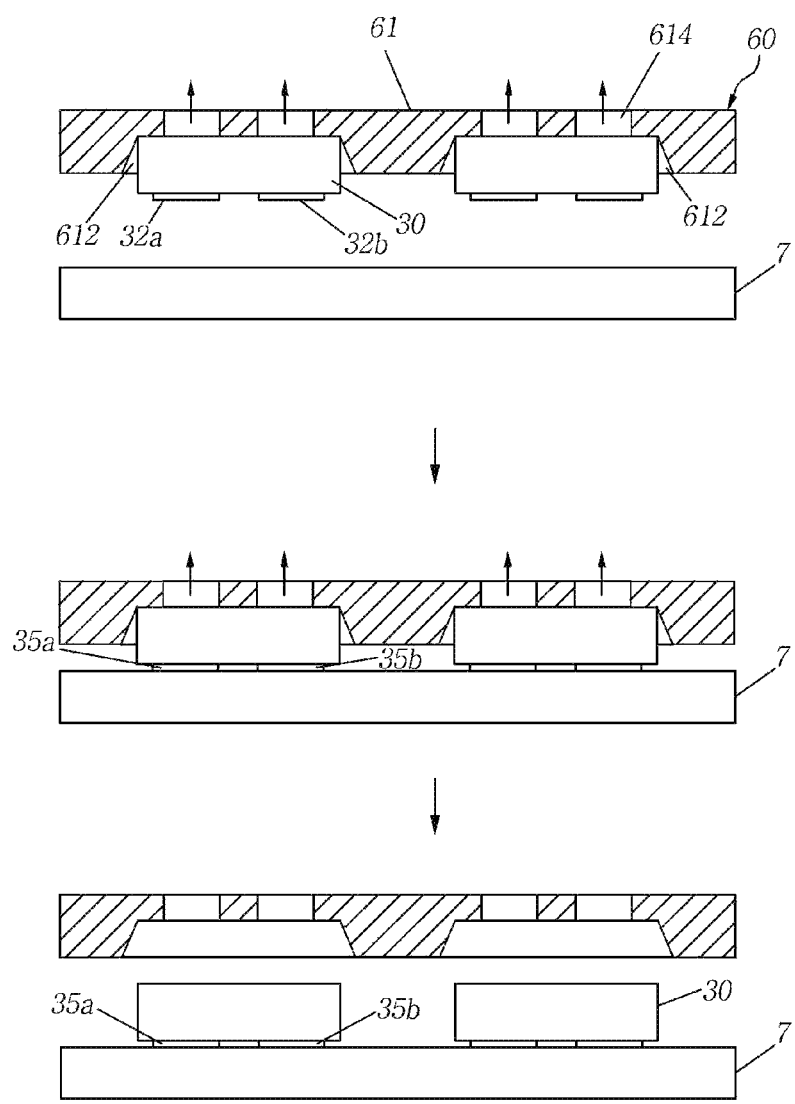
FIGS. 5 and 6 illustrate a further embodiment of a method for arraying LED chips using the multi-chip carrier illustrated in FIGS. 1 and 2.
Figure 6:
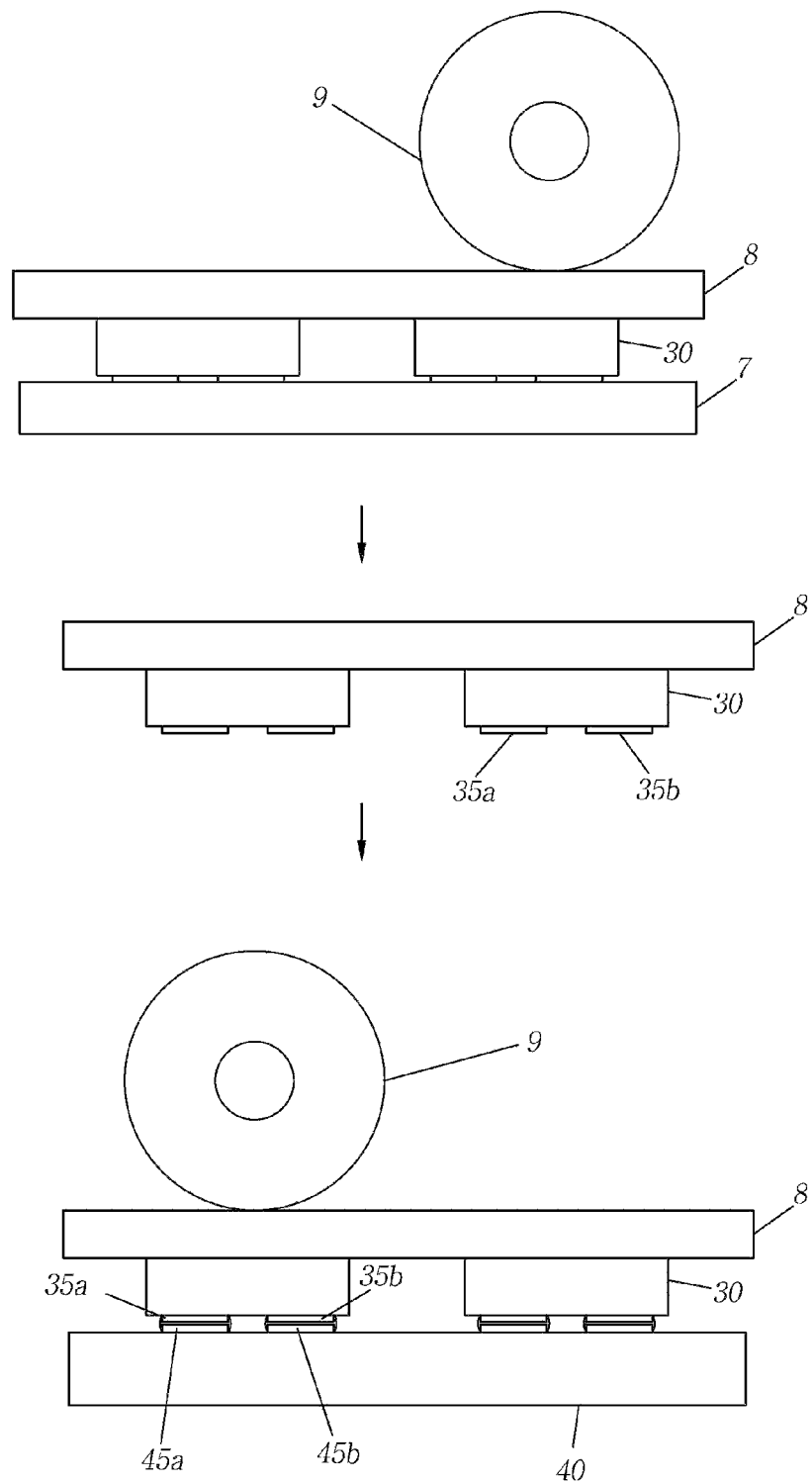

Referring to FIG. 5, the micro-LED chips 30 sucked into chip pockets 612 of the chip carrier 60 can be aligned at predetermined intervals while maintaining their positions. This is possible when the bottom of each of the chip pockets 612 has a shape that can limit the forward, backward, left and right movements of the corresponding micro-LED chip 30 in close contact with the bottom of the chip pocket 612, that is, a shape corresponding to the shape of the micro-LED chip 30. Here, each of the micro-LED chips 30 includes electrode pads 32a and 32b at the side opposite the side adsorbed to the bottom surface of the corresponding chip pocket 612. The electrode pads 32a and 32b correspond to electrodes 45a and 45b of a mount substrate 40, respectively. That is, the chip carrier 60 sucks the micro-LED chips 30 into the chip pockets 612 and accommodates and retains the micro-LED chips 30 such that the light emitting surfaces of the micro-LED chips 30 are in contact with the bottom surfaces of the chip pockets 612 and the electrode pads 32a and 32b are exposed from the chip pockets 612.

A slope 6121 connecting the inlet to the bottom of each chip pocket 612 facilitates insertion of the micro-LED chip 30 into the chip pocket 612 as in the previous embodiment. As described in the previous embodiment, the micro-LED chips accommodated and retained in the corresponding chip pockets 612 may be arranged at the same distances between their centers as the distances between the centers of the chip pockets 612. So long as the internal vacuum of the chip pockets 612 is not released, the arrangement of the micro-LED chips 30 accommodated in the chip pockets 612 and the distances between the micro-LED chips 30 can be maintained unchanged.

The chip carrier 60 is used to place the micro-LED chips 30 sucked into and retained in the chip pockets 612 on the adhesive film 7 in the same manner as in the previous embodiment except that the adhesive film 7 is used instead of the mount substrate. When the suction force applied to the micro-LED chips 30 is removed by increasing the internal pressure of the chip pockets 612 retaining the sucked micro-LED chips 30 in a state in which the micro-LED chips 30, more specifically, the electrode pads 32a and 32b of the micro-LED chips 30, are bonded to the surface of the adhesive film 7, the micro-LED chips 30 are separated from the chip carrier 60 and are bonded to the adhesive film 7.

In this embodiment, the method further includes transferring the micro-LED chips 30 aligned at desired intervals and in a desired arrangement on the adhesive film 7. As illustrated in FIG. 6, the chip transfer includes attaching the micro-LED chips 30 bonded to the surface of the adhesive film 7 to an adhesive transfer film 8 while maintaining their original arrangement and transferring the micro-LED chips 30 attached to the transfer film 8 to the surface of the mount substrate 40 without changing the arrangement of the micro-LED chips 30. A pressure roller 9 may be used to pressurize the micro-LED chips 30 against the transfer film 8 and the mount substrate 40.

The light emitting surfaces of the micro-LED chips 30 are bonded to the transfer film 8 and the opposite surfaces thereof are directed toward the mount substrate 40. As in the previous embodiment, the mount substrate 40 includes electrodes 45a and 45b corresponding to the electrode pads 32a and 32b of the micro-LED chips 30 on the upper surface thereof. The micro-LED chips 30 aligned on the transfer film 8 are transferred to the surface of the mount substrate 40 while maintaining their alignment. Here, the electrode pads 32a and 32b of the micro-LED chips 30 are bonded to the corresponding electrodes 45a and 45b of the mount substrate 40. For this bonding, solders or a conductive bonding material may be used.

Another embodiment of a method for arraying LED chips using the multi-chip carrier illustrated in FIGS. 1 and 2 will be described with reference to FIGS. 7 and 8.

The method includes preparing a chip carrier, capturing chips, and placing the chips as described in the foregoing embodiments. The method further includes transferring the chips.

First, a chip carrier 60 is prepared in substantially the same manner as in the foregoing embodiments.

Micro-LED chips 30 picked up by the chip carrier 60 are placed on the surface of an adhesive film 7.

Figure 7:
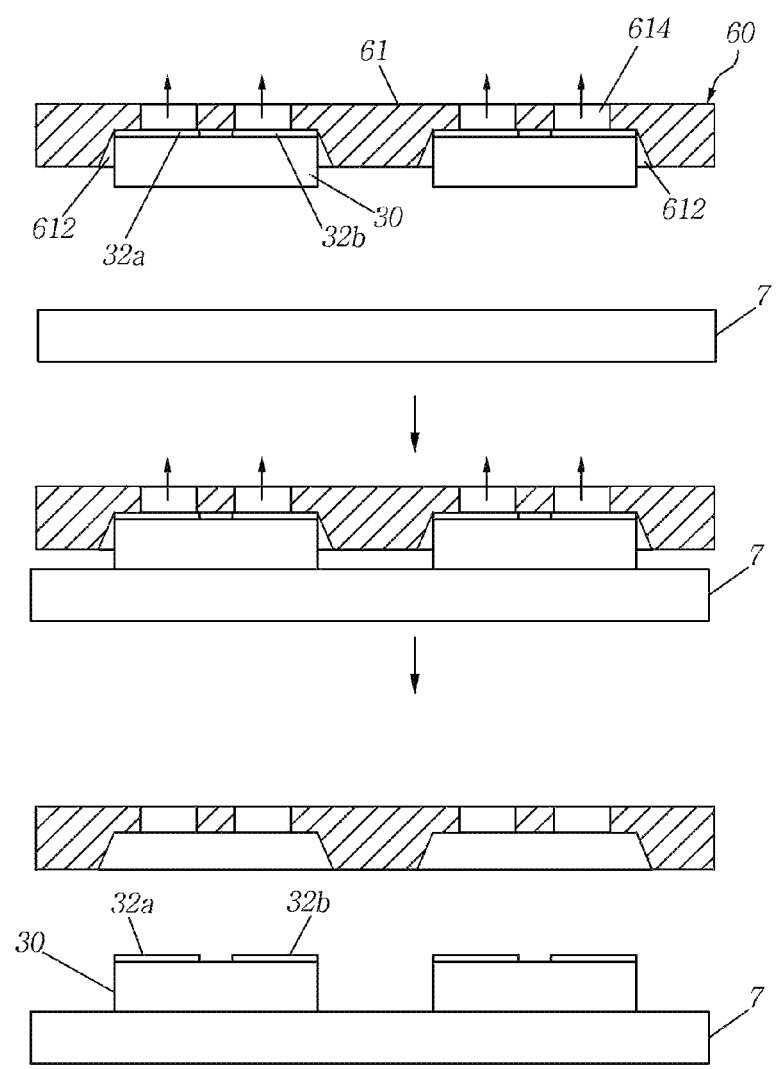
FIGS. 7 and 8 illustrate a method for arraying LED chips using the multi-chip carrier illustrated in FIGS. 1 and 2.
Figure 8:
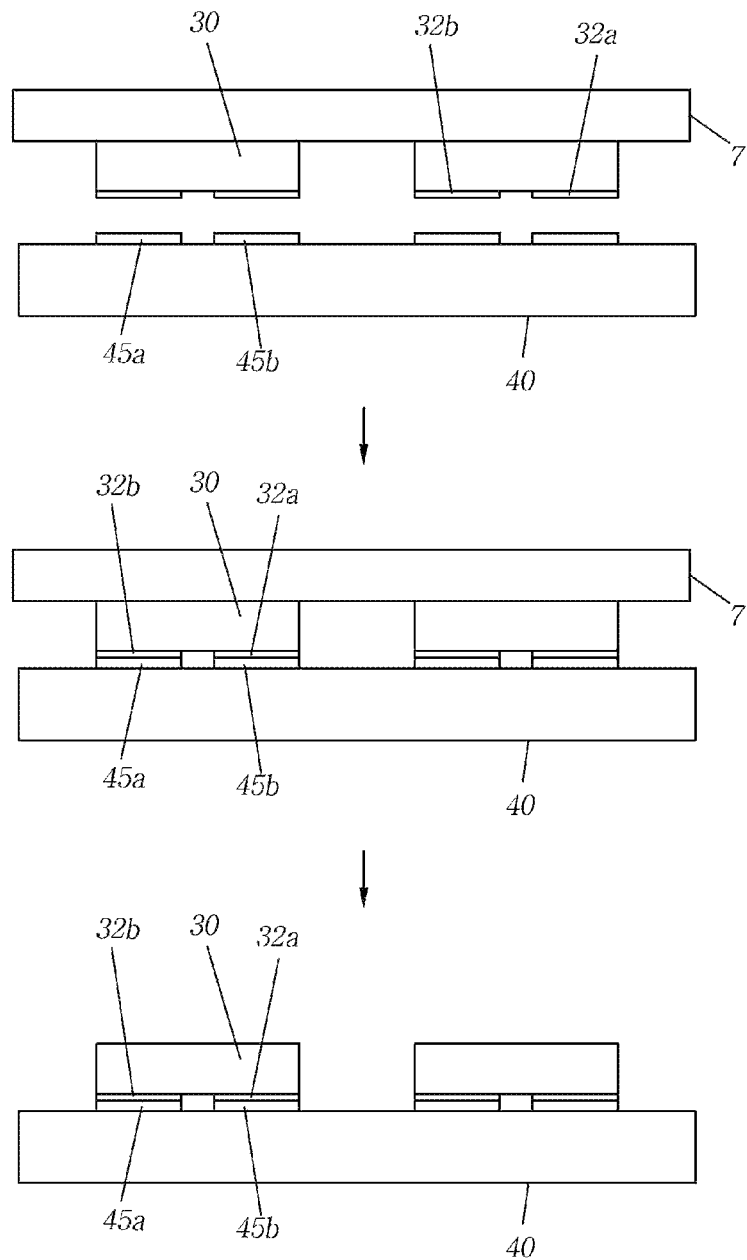

Referring to FIG. 7, the micro-LED chips 30 sucked into chip pockets 612 of the chip carrier 60 can be aligned at predetermined intervals while maintaining their positions. This is possible when the bottom of each of the chip pockets 612 has a shape that can limit the forward, backward, left and right movements of the corresponding micro-LED chip 30 in close contact with the bottom of the chip pocket 612, that is, a shape corresponding to the shape of the micro-LED chip 30. Unlike in the foregoing embodiments, the chip carrier 60 sucks the micro-LED chips 30 into the chip pockets 612 and accommodates and retains the micro-LED chips 30 such that electrode pads 32a and 32b of the micro-LED chips 30 are in contact with the bottoms of the corresponding chip pockets 612 and the light emitting surfaces of the micro-LED chips 30 opposite the electrode pads 32a and 32b are exposed from the chip pockets 612.

The chip carrier 60 is used to place the micro-LED chips 30 sucked into and retained in the chip pockets 612 on the adhesive film 7. When the suction force applied to the micro-LED chips 30 is removed by increasing the internal pressure of the chip pockets 612 retaining the sucked micro-LED chips 30 in a state in which the micro-LED chips 30, more specifically, the electrode pads 32a and 32b of the micro-LED chips 30, are bonded to the surface of the adhesive film 7, the micro-LED chips 30 are separated from the chip carrier 60 and are bonded to the adhesive film 7.

In this embodiment, the method further includes transferring the micro-LED chips 30 aligned at desired intervals and in a desired arrangement on the adhesive film 7. As illustrated in FIG. 8, the micro-LED chips 30 bonded to the adhesive film 7 are directly transferred to the surface of a mount substrate 40 without the need to use a transfer film, unlike in the previous embodiment. Here, the electrode pads 32a and 32b of the micro-LED chips 30 are bonded to the corresponding electrodes 45a and 45b of the mount substrate 40. For this bonding, solders or a conductive bonding material may be used.

Next, the adhesive film 7 is removed.

Figure 9:
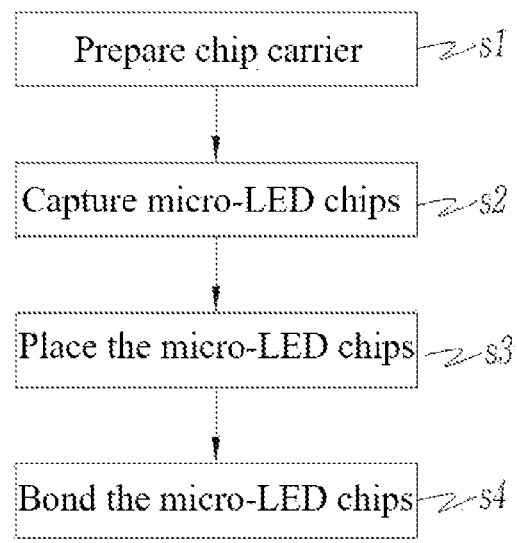
FIG. 9 is a flowchart schematically illustrating a method for arraying LED chips according to another embodiment of the present invention.
Figure 10:
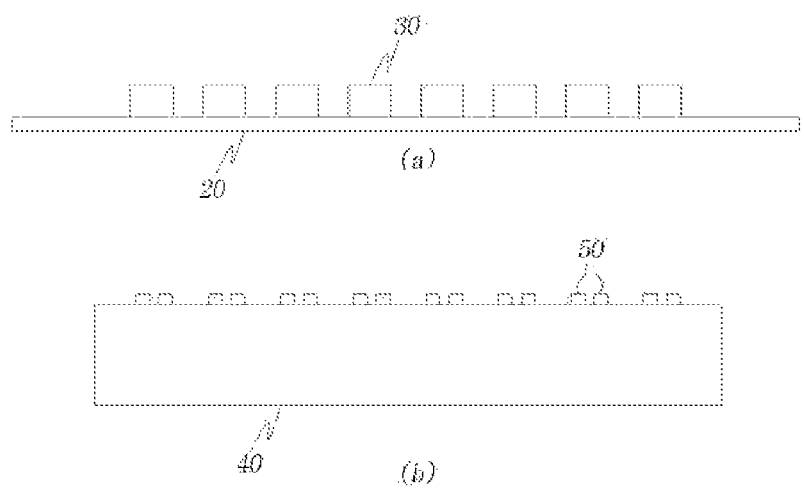
FIG. 10 illustrates (a) a chip retaining film on which micro-LED chips are retained and (b) a substrate on which solders are formed, which are used in the method illustrated in FIG. 9.

FIG. 9 is a flowchart schematically illustrating a method for arraying LED chips according to another embodiment of the present invention. FIG. 10 illustrates (a) a chip retaining film on which micro-LED chips are retained and (b) a substrate on which solders are formed, which are used in the method illustrated in FIG. 9. FIGS. 11 to 18 illustrate individual steps of the method illustrated in FIG. 9.

According to the method illustrated in FIG. 9, micro-LED chips retained on the upper surface of a chip retaining film are arrayed in a predetermined arrangement on a substrate. The method includes (s1) preparing a multi-chip carrier formed with chip pockets in an arrangement consistent with the predetermined arrangement, (s2) reducing the internal pressure of the chip pockets to capture the micro-LED chips in the corresponding chip pockets, (s3) placing the micro-LED chips on a substrate without changing the arrangement of the chip pockets, and (s4) heating solders to bond the micro-LED chips to the surface of the substrate.

A chip retaining film 20 and a substrate 40 are visible in (a) and (b) of FIG. 10, respectively. Micro-LED chips 30 are retained on the chip retaining film 20 and solders 50 are formed on the substrate 40.

Each of the micro-LED chips 30 may be a flip-chip type micro-LED chip with two electrodes having opposite polarities or a vertical type micro-LED chip with one bottom electrode. The micro-LED chips 30 are separated from the chip retaining film 20 and are bonded to the substrate 40 by the following steps. The substrate 40 may be, for example, a PCB. Here, the intervals or arrangement of the micro-LED chips 30 on the chip retaining film 20 are inevitably different from the intervals or arrangement of the micro-LED chips 30 to be mounted on the substrate 40. In the present invention, when the micro-LED chips 30 are picked up from the chip retaining film 20, their positions are adjusted to an arrangement consistent with a desired predetermined arrangement on the substrate 40.

Figure 11:
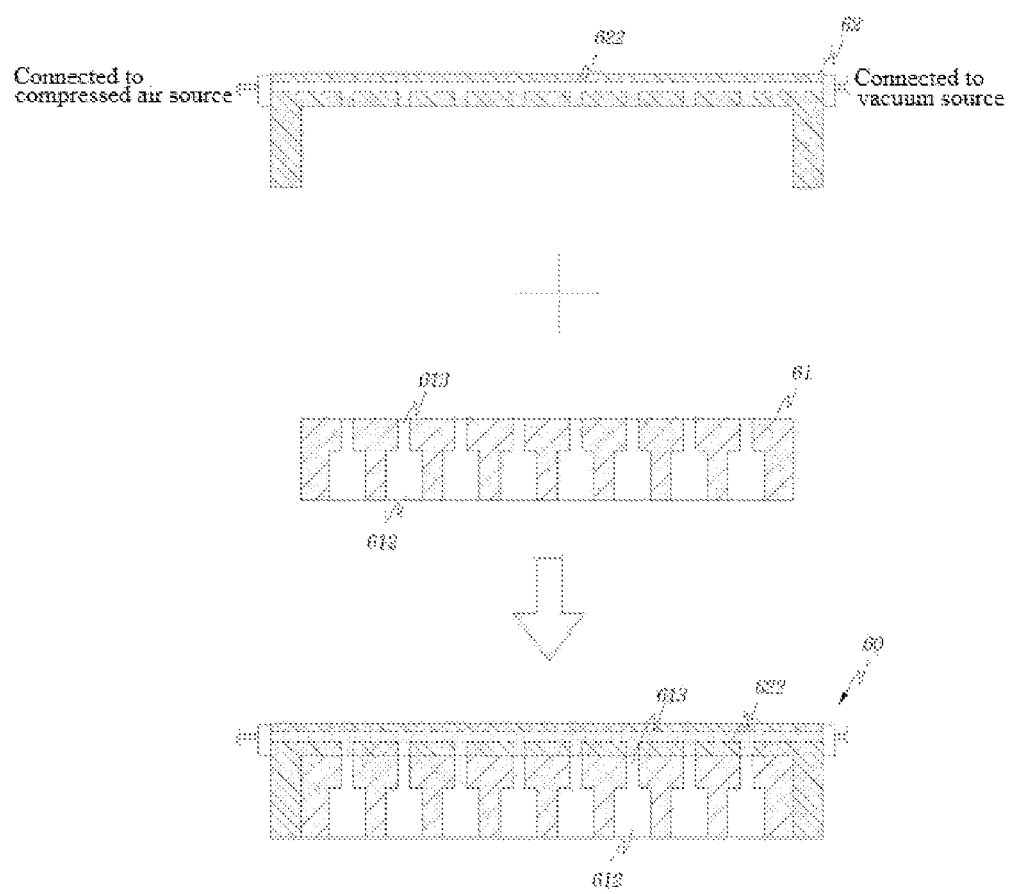
FIGS. 11 to 18 illustrate individual steps of the method illustrated in FIG. 9.

Referring to FIG. 11, a chip carrier 60 is prepared (s1). In the chip carrier 60, chip pockets 612 are formed in an arrangement consistent with a predetermined arrangement of micro-LED chips 30 to be arrayed on a substrate. The chip carrier 60 prepared in s1 is used to pick up the micro-LED chips 30 (see FIG. 10) from a chip retaining film 20 (see FIG. 10), adjust the arrangement of the micro-LED chips 30 (see FIG. 10) to the predetermined arrangement, and place the micro-LED chips 30 on a substrate 40 (see FIG. 10). The same arrangement of the chip pockets 612 as the predetermined arrangement of the micro-LED chips on the substrate means that the pitch between the adjacent two micro-LED chips (i.e. the distance between the centers of the micro-LED chips) is consistent with the pitch between the adjacent two chip pockets 612 (i.e. the distance between the centers of the chip pockets).

s1 includes coupling a suction plate 61 formed with the chip pockets 612 to a chuck 62 formed with a vacuum/compressed air channel 622 such that the channel 622 is in communication with the chip pockets 612. A vacuum source is connected to the vacuum/compressed air channel 622 to create a vacuum in the chip pockets 612. The reduced internal pressure of the chip pockets 612 allows the micro-LED chips 30 to be sucked into the chip pockets 612.

The micro-LED chips 30 (see FIG. 10) can be pushed out by increasing the internal pressure of the chip pockets 612. The internal pressure of the chip pockets 612 can be increased through the vacuum/compressed air channel 622.

A vacuum is created in the vacuum/compressed air channel 622. Alternatively, compressed air may flow through the vacuum/compressed air channel 622.

The suction plate 61 is produced by forming the chip pockets 612 and connection holes 613 connected to the chip pockets 612 in a plate made of Si, GaAs, sapphire or AlN. Each of the chip pockets 612 has a first depth and each of the connection holes 613 has a second depth smaller than the first depth. The cross-sectional area of each of the chip pockets 612 is designed to be slightly larger than that of the corresponding micro-LED chip 30. Each of the connection holes 613 is formed on the upper end of the corresponding chip pocket 612 and has a smaller cross-sectional area than the corresponding micro-LED chip 30. Due to this construction, the upper end of the chip pocket 612 prevents the micro-LED chip 30 from ascending further when suction occurs in the chip pocket 612. The chip pockets 612 and the connection holes 613 can be formed by etching. The first depth is preferably from 10 to 2000 μm and the second depth is preferably from 1 to 100 μm.

The vacuum/compressed air channel 622 of the chuck 62 is in communication with the chip pockets 612 of the suction plate 61 through the connection holes 613 of the suction plate 61. More specifically, the chuck 62 is structured such that when a vacuum is created in the vacuum/compressed air channel 622, the internal pressure of the chip pockets 612 is reduced to a vacuum sufficient to pick up the micro-LED chips 30 (see FIG. 10). The chuck 62 has a structure in which when the internal pressure of the chip pockets 612 is increased through the vacuum/compressed air channel 622, the micro-LED chips can be bonded to the substrate 40 by pressurization with compressed air.

The chuck 62 is made of iron, a ceramic material, Teflon or a plastic material.

The multi-chip carrier 60 is used in the subsequent steps.

Figure 12:
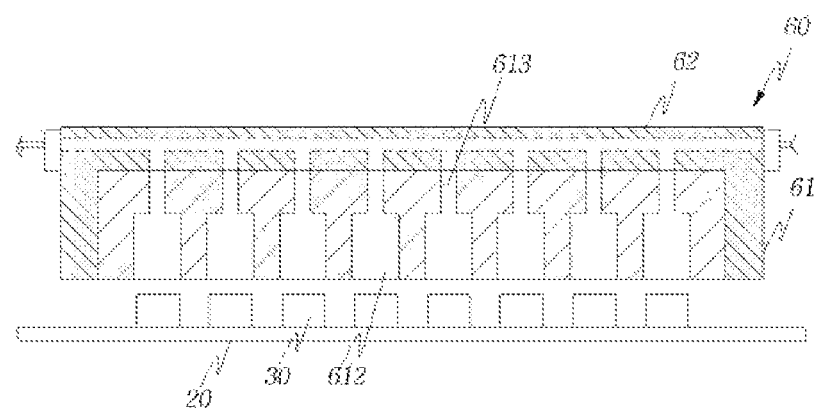
Figure 13:
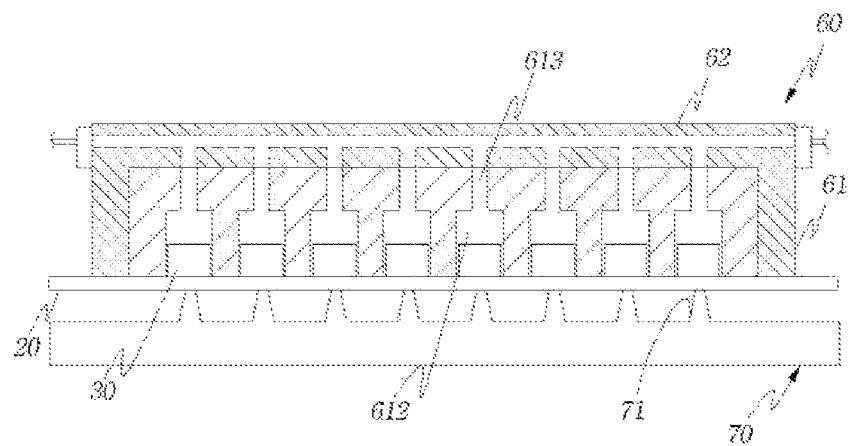
Figure 14:
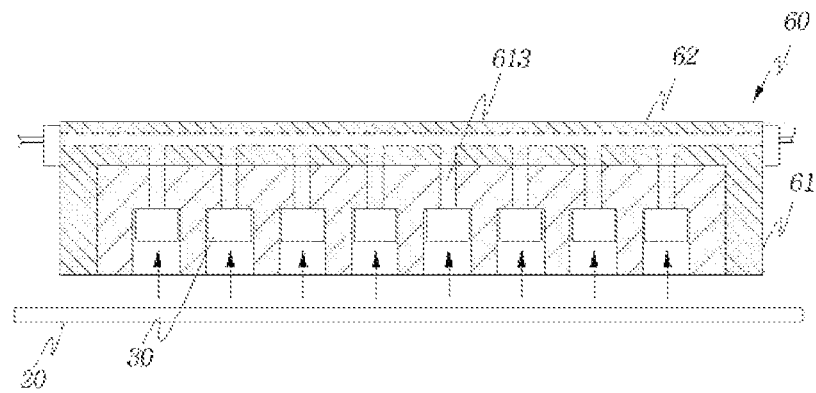

Referring to FIGS. 12 to 14, in s2, the micro-LED chips 30 are captured in the corresponding chip pockets 612.

Before capture of the micro-LED chips 30, the chip carrier 60 is aligned such that the chip pockets 612 are at least partially in contact with the corresponding micro-LED chips 30, as illustrated in FIGS. 12 and 13. When the internal pressure of the chip pockets 612 is reduced in a state in which the chip pockets 612 are in partial contact with the corresponding micro-LED chips 30 whose arrangement and pitches are different from those of the chip pockets 612, the micro-LED chips 30 are introduced into the chip pockets 612, and as a result, the arrangement and pitches of the micro-LED chips 30 are consistent with those of the chip pockets 612, which will be described below.

Next, a vacuum source is driven to reduce the internal pressure of the chip pockets 612. As a result, the micro-LED chips 30 are sucked into and accommodated in the corresponding chip pockets 612, as illustrated in FIGS. 13 and 14. The micro-LED chips 30 sucked into the chip pockets 612 ascend to the upper ends of the chip pockets 612 where the connection holes 613 are formed. The upper ends of the chip pockets 612 prevent the micro-LED chips 30 from ascending further. In other words, the connection holes 613 are closed by the micro-LED chips 30 and the micro-LED chips 30 are stopped and held in contact with the upper ends of the chip pockets 612 because the vacuum suction is applied continuously. The depth of each of the chip pockets 612 is larger than the thickness of the corresponding micro-LED chip 30. With these dimensions, a sufficient distance can be ensured to provide a sufficient force that allows the micro-LED chip 30 to slide down along the chip pocket 612 when the micro-LED chip 30 is placed on the substrate in the subsequent step.

In s2, the vacuum created in the chip pockets 612 allows for suction of the micro-LED chips 30 and a force is applied to the bottom surface of the chip retaining film 20 to push the micro-LED chips 30 into the chip pockets 612. A fin structure 70 including fins 71 corresponding to the chip pockets 612 is used to push the micro-LED chips 30 into the chip pockets 612. Despite non-uniform arrangement of the micro-LED chips 30 retained on the chip retaining film 20, the suction of the micro-LED chips 30 in the chip pockets 612 and the function of the fins 71 to push the micro-LED chips 30 into the corresponding chip pockets 612 facilitate accommodation of the micro-LED chips 30 in the chip pockets 612. Flexibility of the chip retaining film 20 is a prerequisite for the use of the fins 71 to push the micro-LED chips 30 into the chip pockets 612.

Figure 15:
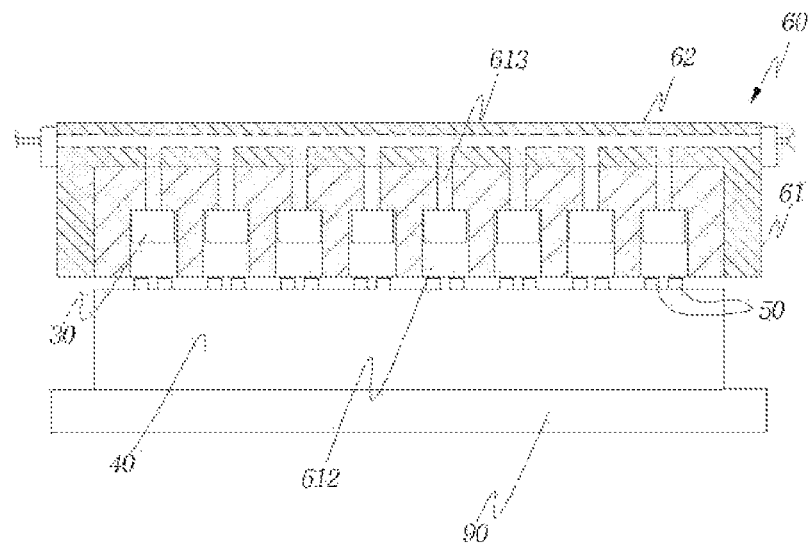
Figure 16:
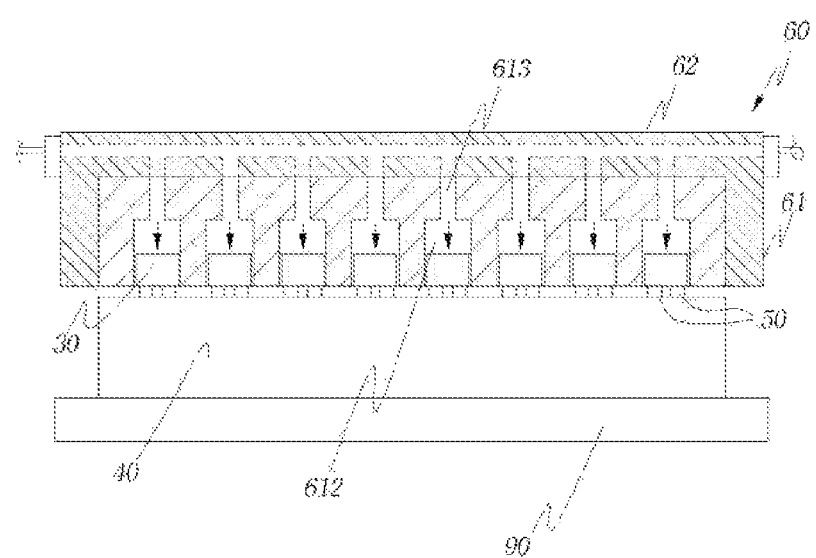

Next, the micro-LED chips 30 are placed on the substrate 40 while maintaining the arrangement of the chip pockets 612 (s3), as illustrated in FIGS. 15 and 16.

s3 is carried out after the substrate 40 is aligned with the chip carrier 60 such that solders 50 disposed on the substrate 40 correspond to the micro-LED chips 30 captured in the chip pockets 612. In the case where each of the LED chips is a flip-chip type LED chips including two bottom electrodes having opposite polarities, two solder joints bonded to the two electrodes of the LED chip are considered to be one solder. Accordingly, the solder 50 corresponding to each micro-LED chip 30, in practice, includes two solder joints bonded to two electrode pads disposed on the bottom surface of the micro-LED chip 30, as illustrated in FIGS. 15 and 16.

When the internal vacuum of the chip pockets 612 is released in a state in which the chip carrier 60 is aligned with the substrate 40, the micro-LED chips 30 fall down and are placed on the substrate 40. Here, the micro-LED chips 30 are strongly pressurized to the substrate 40 by the pressure of compressed air supplied to the chip pockets 612, contributing to an increase in bonding or preliminary attachment strength in the subsequent step. As mentioned earlier, the micro-LED chips 30 descend a predetermined distance in the chip pockets 612 in the direction of arrows shown in FIG. 16 and are placed on the substrate 40. The inner sides of the chip pockets 612 guide the descent of the micro-LED chips 30. This guiding ensures a more precise array of the micro-LED chips.

Figure 17:
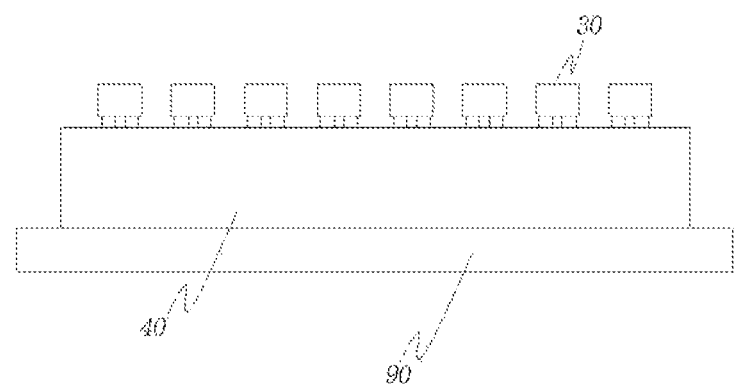

Subsequently to or almost simultaneously with s3, the solders 50 disposed on the substrate 40 are heated to bond the micro-LED chips 30 to the surface of the substrate 40 (s4), as illustrated in FIGS. 16 and 17. In this embodiment, s4 is carried out by heating the solders 50 disposed on the substrate using a heating block 90 in contact with the substrate 40. The use of the heating block 90 enables the use of the downward compression force applied to the micro-LED chips 30 as a force to mount the micro-LED chips 30. Alternatively, s4 may be carried out after preliminary bonding of the micro-LED chips 30 to the substrate 40 at room temperature. In this case, s4 may be carried out by reflow without the need to use the heating block.

Figure 18:
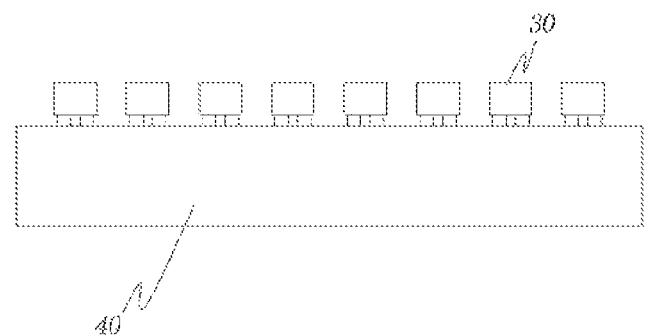

Referring to FIG. 18, the substrate 40 and the micro-LED chips 30 arrayed on the substrate 40 are separated from the heating block 90 (see FIG. 17).

What is claimed is:
1. A method for arraying micro-LED chips comprising:
preparing a chip carrier formed with a plurality of chip pockets whose internal pressure is reduced through a plurality of suction holes;
capturing the micro-LED chips in the corresponding chip pockets such that the micro-LED chips are in close contact with the bottoms of the chip pockets;
placing the micro-LED chips captured in the chip pockets on a base body; and
half-turning the chip carrier in which the captured micro-LED chips are aligned in the corresponding chip pockets,
wherein each of the chip pockets comprises a slope through which an inlet having a larger width than the bottom is connected to the bottom and wherein the distances between the centers of the adjacent micro-

LED chips placed on the base body are the same as those between the centers of the corresponding chip pockets.

2. The method according to claim 1, wherein the movement of each of the micro-LED chips aligned in the chip pockets is limited by the slope.

3. The method according to claim 1, wherein the depth of each of the chip pockets is smaller than the thickness of the corresponding micro-LED chip.

4. The method according to claim 1, wherein the suction holes are in communication with the corresponding chip pockets at the bottom of the chip carrier.

5. The method according to claim 4, wherein the number of the suction holes for each of the chip pockets is two or more.

6. The method according to claim 1, wherein the chip pockets are formed at one side of a suction plate of the chip carrier, and the suction holes are formed at the other side of the suction plate and are in communication with the bottoms of the corresponding chip pockets.

7. The method according to claim 1, wherein the placing comprises increasing the internal pressure of the chip pockets in a state in which the micro-LED chips are placed on the base body.

8. The method according to claim 1, wherein electrode pads of the micro-LED chips protrude upward from the corresponding chip pockets of the chip carrier when the micro-LED chips are captured and protrude downward from the corresponding chip pockets of the chip carrier when the micro-LED chips are placed.

9. A method for arraying micro-LED chips comprising:
preparing a chip carrier formed with a plurality of chip pockets whose internal pressure is reduced through a plurality of suction holes;
capturing the micro-LED chips in the corresponding chip pockets such that the micro-LED chips are in close contact with the bottoms of the chip pockets; and
placing the micro-LED chips captured in the chip pockets on a base body,
wherein each of the chip pockets comprises a slope through which an inlet having a larger width than the bottom is connected to the bottom and wherein the distances between the centers of the adjacent micro-LED chips placed on the base body are the same as those between the centers of the corresponding chip pockets, and
wherein the micro-LED chips are captured in the corresponding chip pockets such that the light emitting surfaces of the micro-LED chips are in contact with the bottoms of the chip pockets and electrode pads of the micro-LED chips are exposed from the chip pockets.

10. The method according to claim 9, wherein the base body is a mount substrate having electrodes and the micro-LED chips are placed on the mount substrate such that the electrode pads are close to the electrodes.

11. The method according to claim 9, wherein the base body is an adhesive film and the micro-LED chips are placed on the adhesive film such that the electrode pads are attached to the adhesive film.

12. The method according to claim 11, further comprising transferring the micro-LED chips attached to the surface of the adhesive film to the surface of the mount substrate.

13. A method for arraying micro-LED chips comprising:
preparing a chip carrier formed with a plurality of chip pockets whose internal pressure is reduced through a plurality of suction holes;
capturing the micro-LED chips in the corresponding chip pockets such that the micro-LED chips are in close contact with the bottoms of the chip pockets; and
placing the micro-LED chips captured in the chip pockets on a base body,
wherein each of the chip pockets comprises a slope through which an inlet having a larger width than the bottom is connected to the bottom and wherein the distances between the centers of the adjacent micro-LED chips placed on the base body are the same as those between the centers of the corresponding chip pockets, and
wherein the micro-LED chips are captured in the corresponding chip pockets such that electrode pads of the micro-LED chips are in contact with the bottoms of the chip pockets and the light emitting surfaces of the micro-LED chips are exposed from the chip pockets.

* * * * *